United States Patent
Piron et al.

(10) Patent No.: US 10,620,280 B2
(45) Date of Patent: *Apr. 14, 2020

(54) SYSTEM AND METHOD FOR MAGNETIC RESONANCE IMAGE ACQUISITION

(71) Applicant: SYNAPTIVE MEDICAL (BARBADOS) INC., Bridgetown (BB)

(72) Inventors: Cameron Anthony Piron, Toronto (CA); Alex Panther, Toronto (CA); Vincent Luciani, Toronto (CA); Chad Tyler Harris, Toronto (CA)

(73) Assignee: SYNAPTIVE MEDICAL (BARBADOS) INC., Bridgetown (BB)

( * ) Notice: Subject to any disclaimer, the term of this patent is extended or adjusted under 35 U.S.C. 154(b) by 210 days.

This patent is subject to a terminal disclaimer.

(21) Appl. No.: 15/603,658

(22) Filed: May 24, 2017

(65) Prior Publication Data

US 2017/0261571 A1 Sep. 14, 2017

Related U.S. Application Data

(63) Continuation of application No. 14/774,501, filed as application No. PCT/CA2014/000245 on Mar. 14, 2014, now Pat. No. 9,696,392.

(Continued)

(51) Int. Cl.
*G01R 33/34* (2006.01)
*G01R 33/3415* (2006.01)
(Continued)

(52) U.S. Cl.
CPC ..... *G01R 33/34046* (2013.01); *G01R 33/341* (2013.01); *G01R 33/34007* (2013.01);
(Continued)

(58) Field of Classification Search
CPC ........ G01R 33/34046; G01R 33/34007; G01R 33/3415; G01R 33/365; G01R 33/341;
(Continued)

(56) References Cited

U.S. PATENT DOCUMENTS

| 7,609,868 B2 * | 10/2009 | Kuth ..................... A61B 5/055 382/128 |
| 8,144,962 B2 * | 3/2012 | Busch .................. G06T 11/006 378/4 |

(Continued)

FOREIGN PATENT DOCUMENTS

JP 2003000564 A 1/2003

OTHER PUBLICATIONS

Piron, Cameron Anthony, U.S. Appl. No. 14/774,501, filed Sep. 10, 2015.

*Primary Examiner* — Dixomara Vargas
(74) *Attorney, Agent, or Firm* — Perry + Currier Inc.

(57) ABSTRACT

A method of data acquisition at a magnetic resonance imaging (MRI) system is provided. The system receives at least a portion of raw data for an image, and detects anomalies in the portion of raw data received. When anomalies are detected, the system can correct those anomalies dynamically, without waiting for a new scan to be ordered. The system can attempt to scan the offending portion of the raw data, either upon detection of the anomaly or at some point during the scan. The system can also correct anomalies using digital correction methods based on expected values. The anomalies can be detected based on variations from thresholds, masks and expected values all of which can be obtained using one of the ongoing scan, previously performed scans and apriori information relating to the type of scan being performed.

6 Claims, 8 Drawing Sheets

Related U.S. Application Data

(60) Provisional application No. 61/799,504, filed on Mar. 15, 2013.

(51) Int. Cl.
*G01R 33/36* (2006.01)
*G01R 33/565* (2006.01)
*G01R 33/341* (2006.01)
*G01R 33/385* (2006.01)
*G01R 33/48* (2006.01)
*G01R 33/54* (2006.01)
*G01R 33/56* (2006.01)

(52) U.S. Cl.
CPC ... *G01R 33/3415* (2013.01); *G01R 33/34084* (2013.01); *G01R 33/365* (2013.01); *G01R 33/385* (2013.01); *G01R 33/482* (2013.01); *G01R 33/4818* (2013.01); *G01R 33/546* (2013.01); *G01R 33/565* (2013.01); *G01R 33/5608* (2013.01)

(58) Field of Classification Search
CPC .............. G01R 33/385; G01R 33/4818; G01R 33/546; G01R 33/34084; G01R 33/482
See application file for complete search history.

(56) References Cited

U.S. PATENT DOCUMENTS

| | | | |
|---|---|---|---|
| 9,696,392 B2* | 7/2017 | Piron | G01R 33/565 |
| 9,797,968 B2* | 10/2017 | Piron | H03M 1/183 |
| 2006/0239529 A1* | 10/2006 | Kuth | A61B 5/055 |
| | | | 382/130 |
| 2016/0025832 A1* | 1/2016 | Piron | G01R 33/565 |
| | | | 324/322 |
| 2017/0160359 A1* | 6/2017 | Piron | H03M 1/183 |
| 2018/0059195 A1* | 3/2018 | Lai | G01R 33/565 |

* cited by examiner

SYSTEM AND METHOD FOR MAGNETIC RESONANCE IMAGE ACQUISITION

RELATED APPLICATIONS

This application is a continuation of U.S. patent application Ser. No. 14/774,501, filed Sep. 10, 2015, which is a 371 of International Patent Application PCT/CA2014/000245 filed Mar. 14, 2014, which claims priority from U.S. patent application 61/799,504, filed Mar. 15, 2013. Priority is claimed to this earlier filed application and the contents of this earlier filed application are incorporated herein, in its entirety, by reference.

FIELD OF THE INVENTION

The present invention relates generally to magnetic resonance imaging. More specifically, the present invention relates to a system and method for detecting errors in acquired signals.

BACKGROUND OF THE INVENTION

Magnetic resonance imaging (MRI) is a major imaging technique used in medicine. MRI is capable of generating detailed images of soft tissues such as the brain, muscles and kidneys. Specific properties of the various compounds found inside tissues, such as water and/or fat, are used to generate images. When subjected to a strong magnetic field, the vector sum of the nuclear magnetic moments of a large number of atoms possessing a nuclear spin angular momentum, such as Hydrogen, which is abundant in water and fat, will produce a net magnetic moment in alignment with the externally applied field. The resultant net magnetic moment will furthermore precess with a well-defined frequency that is proportional to the applied magnetic field. After excitation by radio frequency pulses, the net magnetization will generate a signal that can be detected.

Small anomalies in detected signals can cause an entire image to be corrupted. The corrupted images are typically not discovered until the scan is complete for the object, and images are presented for review to technicians and other qualified personnel. Given the scan times required for scanning an object, this can be quite costly. It would therefore be advantageous to be able to detect and potentially correct the anomalies prior to presenting the images of a completed scan for review.

SUMMARY OF THE INVENTION

It is an object to provide a novel system and method for an MRI scanning system and method that obviates and mitigates at least one of the above-identified disadvantages of the prior art.

According to an aspect a method of data acquisition at a magnetic resonance imaging (MRI) system is provided. According to the method, the system can receive at least a portion of raw data for an image, detecting anomalies in the portion of raw data and performing a correction of the anomalies. The correction can involve performing a partial scan to obtain replacements for the anomalous data. Alternatively, the correction can involve replacing the anomalies with one or more expected values.

One or more expected values can be calculated on the basis of at least one of averaging, interpolation or conjugate symmetry. The raw data can correspond to k-space data for the image. The received portion of raw data can be at least one line of data along the frequency axis of the k-space. The partial scan can be performed prior to receiving any additional raw data, after all of the raw data for the image is received, or after all of the raw data for all of the images to be scanned is received.

Detecting anomalies can include comparing the portion of raw data received to a mask. The mask can include an upper boundary and the detection can be based on whether one or more values of the portion of raw data received exceed corresponding upper boundary values. The mask can also include a lower boundary and the detection can be based on whether one or more values of the portion of raw data received are below corresponding lower boundary values. The mask can be determined at least in part based on apriori information including at least one of: type of object being scanned, type of the MRI system, expected distribution of raw data values or raw data obtained from phantom scans.

The mask values can also be expected values for the partial data varied by a pre-determined percentage. The detecting of anomalies can further comprise comparing values for each cell of the portion of raw data to an expected value for that cell. The expected value can be based on values of each cell's neighbors. The expected value can be determined on the basis of at least one of averaging, interpolation or conjugate symmetry. Detecting anomalies can further include comparing a signal to noise ratio of at least a portion of raw data received to a predetermined signal to noise ratio for a phantom. Detecting anomalies and performing a partial scan can be performed prior to receiving any additional raw data, after all of the raw data for the image is received, or after all of the raw data for all of the images to be scanned is received. The portion of raw data for an image can be obtained by one of a low resolution scan or a pre-scan.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION

Figure 1:
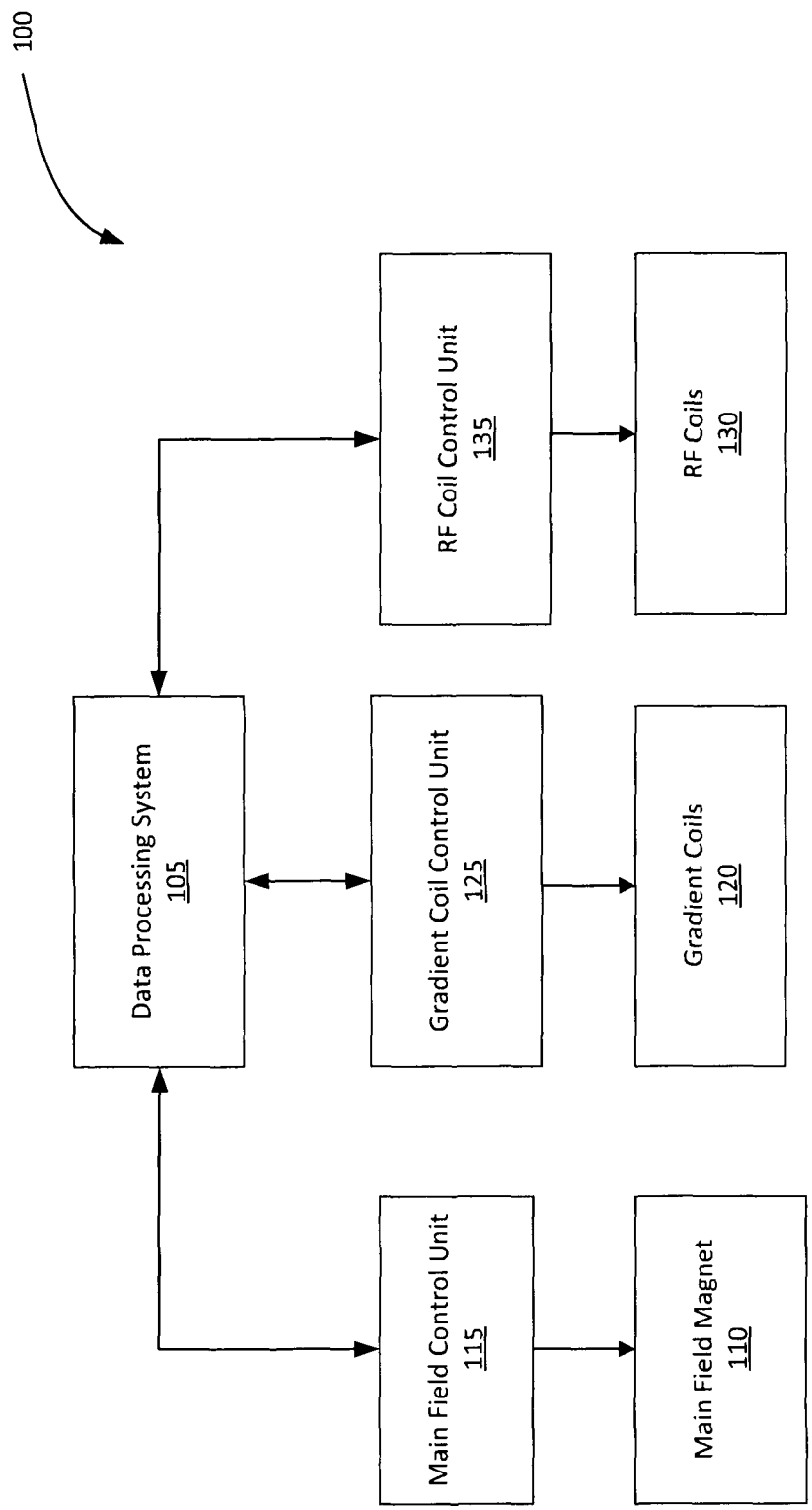
FIG. 1 shows a block diagram of functional subsystems of a magnetic resonance imaging system in accordance with an implementation.

Referring to FIG. 1, a block diagram of a magnetic resonance imaging (MRI) system, in accordance with an exemplary implementation, is shown at 100. The example implementation of MRI system indicated at 100 is for illustrative purposes only, and variations including additional, fewer and/or varied components are possible. MRI is an imaging modality which is primarily used to construct pictures of nuclear magnetic resonance (NMR) signals from hydrogen atoms in an object. In medical MRI, typical signals of interest are NMR signals from water and fat, the major hydrogen containing components of tissues.

As shown in FIG. 1, the MRI system 100 comprises a data processing system 105. The data processing system 105 generally comprises one or more output devices such as a display, one or more input devices such as a keyboard and a mouse as well as one or more processors connected to a memory having volatile and persistent components. The data processing system 105 further comprises an interface adapted for communication and data exchange with the hardware components of MRI system 100 used for performing a scan.

Continuing with FIG. 1, example MRI system 100 also includes a main field magnet 110. The main field magnet 110 can be implemented as a permanent, superconducting or a resistive magnet, for example. Other magnet types, including hybrid magnets suitable for use in MRI system 100 will now occur to a person of skill and are contemplated. Main field magnet 110 is operable to produce a substantially uniform magnetic field B0 having a direction along an axis. The magnetic field B0 is used to create an imaging volume within which desired atomic nuclei, such as the protons in Hydrogen within water and fat, of an object are magnetically aligned in preparation for a scan. In some implementations, as in this example implementation, a main field control unit 115 in communication with data processing system 105 can be used for controlling the operation of main field magnet 110.

MRI system 100 further includes gradient coils 120 used for encoding spatial information in the main magnetic field B0 along, for example, three perpendicular axis. The size and configuration of the gradient coils 120 can be such that they produce a controlled and uniform linear gradient. For example, three paired orthogonal current-carrying gradient coils 120 located within the main field magnet 110 can be designed to produce desired linear gradient magnetic fields. The magnetic fields produced by the gradient coils 120, in combination and/or sequentially, can be superimposed on the main magnetic field B0 such that selective spatial excitation of objects within the imaging volume can occur. In addition to allowing spatial excitation, the gradient coils 120 can attach spatially specific frequency and phase information to the atomic nuclei, allowing the resultant MR signal to be reconstructed into a useful image. A gradient coil control unit 125 in communication with data processing system 100 is used to control the operation of gradient coils 120.

The MRI system 100 further comprises radio frequency (RF) coils 130. The RF coils 130 are used to establish a magnetic field B1 to excite the atomic nuclei or "spins". The RF coils 130 can also detect signals emitted from the "relaxing" spins within the object being imaged. Accordingly, the RF coils 130 can be in the form of separate transmit and receive coils or a combined transmit and receive coil with a switching mechanism for switching between transmit and receive modes.

The RF coils 130 can be implemented as surface coils, which are typically receive only coils and/or volume coils which can be receive and transmit coils. RF coils 130 can be integrated in the main field magnet 110 bore. Alternatively, RF coils 130 can be implemented in closer proximity to the object to be scanned, such as a head, and can take a shape that approximates the shape of the object, such as a close-fitting helmet. An RF coil control unit 135 in communication with data processing system 100 is used to control the operation of the RF coils 130.

To create an image, MRI system 100 detects the presence of atomic nuclei containing spin angular momentum in an object, such as those of hydrogen protons in water or fat found in tissues, by subjecting the object to a large magnetic field. In this example implementation the main magnetic field is denoted as B0 and the atomic nuclei containing spin angular momentum will be Hydrogen protons or simply protons. Magnetic field B0 partially polarizes the Hydrogen protons in the object placed in the imaging volume of the main magnet 110. The protons are then excited with appropriately tuned RF radiation, in this example magnetic field B1. Finally, weak RF radiation signal from the excited protons is detected as they "relax" from the magnetic interaction. The frequency of the detected signal is proportional to the magnetic field to which they are subjected. Cross-section of the object from which to obtain signals can be selected by producing a magnetic field gradient across the object so that magnetic field values of B0 can be varied along various locations in the object. Given that the signal frequency is proportional to the varied magnetic field created, the variations allow assigning a particular signal frequency and phase to a location in the object. Accordingly, sufficient information can be found in the obtained signals to construct a map of the object in terms of proton presence, which is the basis of an MRI image. For example, since proton density varies with the type of tissue, tissue variations can be mapped as image contrast variations after the obtained signals are processed.

To obtain images from the MRI system 100 in the manner described above, one or more sets of RF pulses and gradient waveforms (collectively called "pulse sequences") are selected at the data processing system 105. The data processing system 105 passes the selected pulse sequence information to the RF control unit 135 and the gradient control unit 125, which collectively generate the associated waveforms and timings for providing a sequence of pulses to perform a scan.

Figure 2:
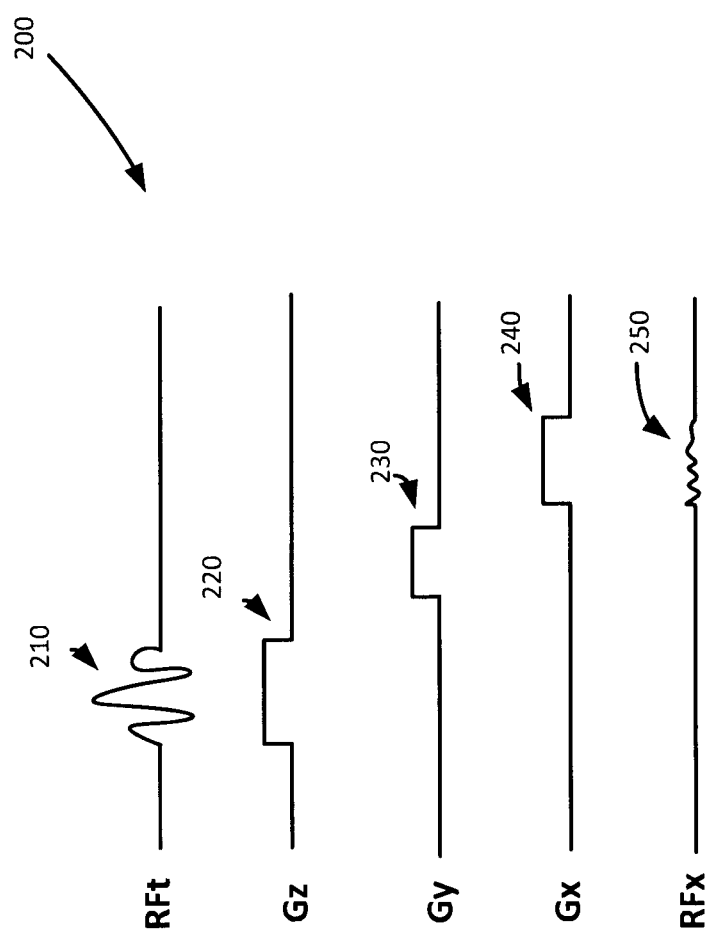
FIG. 2 shows an example pulse sequence in accordance with an implementation.

Referring now to FIG. 2, an illustrative pulse sequence 200 is shown that can be used to acquire images using the MRI system 100. Specifically, a timing diagram for the example pulse sequence is indicated. The timing diagram shows pulse or signal magnitudes, as a function of time, for transmitted RFt signal, magnetic field gradients $G_x$, $G_y$, and $G_z$, and received RFx signal. An idealized pulse sequence, simplified for illustrative purposes, contains a slice selection pulse 210 at RFt, a slice selection gradient pulse 220 at Gz, a phase encoding gradient pulse 230 at Gy, a frequency encoding gradient pulse 240 at Gx, as well as a detected signal 250 at RFx. The pulses for the three gradients Gx, Gy, and Gz represent the magnitude and duration of the magnetic field gradients generated by the gradient coils 120. The slice selection pulse 210 is generated by the transmit aspect of RF coils 130. Detected signal 250 is detected by the receive aspect of the RF coils 130. In this illustrative example it will be assumed that transmit aspect and receive aspect of RF coils 130 are formed by distinct coils.

The first event to occur in pulse sequence 200 is to turn on the slice selection gradient pulse 220. The slice selection pulse 210 is applied at the same time. In this illustrative example, the slice selection pulse 210 is a sinc function shaped burst of RF energy. In other implementations, other RF pulse shapes and durations can be used. Once the slice selection pulse 210 is turned off, the slice selection gradient pulse 220 is also turned off and a phase encoding gradient pulse 230 is turned on. Once the phase encoding gradient pulse 230 is turned off, a frequency encoding gradient pulse 240 is turned on and a detected signal 250 is recorded. It should be noted that the shapes, magnitudes and durations of the pulses and signals shown in FIG. 2 are chosen for illustrative purposes, and that in implementations, one or more of these factors and others may be varied to achieve the desired scan results.

The pulse sequence 200 is repeated a certain number of times, typically 256 times, to collect all the data needed to produce one image. The time between each repetition of the pulse sequence 200 is referred to as the repetition time (TR). Moreover, the duration between the center point of the slice selection pulse 210 and the peak of detected signal 250 is referred to as echo time (TE). Both TR and TE can be varied as appropriate for a desired scan. In some implementations, each time pulse sequence 200 is repeated, the magnitude of the phase encoding gradient pulse 230 is changed. For example, the magnitude can be changed in equal steps between a maximum amplitude and a minimum amplitude of the phase encoding gradient Gy. The variations in amplitude produce a variation in the phase of the precessing nuclei across the object being scanned, providing sufficient information for localization of detected signals 250 received for each repetition of pulse sequence 200. For example, pulse sequence 200 can be repeated 256 times with 256 equal magnitude steps of phase encoding gradient pulse 230 to obtain 256 distinct phase offsets containing spatial information in the direction of the phase encoding gradient field. If during the receive period of the pulse sequence, the detected signal 250 is sampled at 256 time points, an image containing 256×256 voxels within the selected slice can be produced after processing. The slice selection gradient pulse 220 can then be varied to acquire an image for a different slice. This process can continue until the desired number of slices are imaged.

Figure 3:
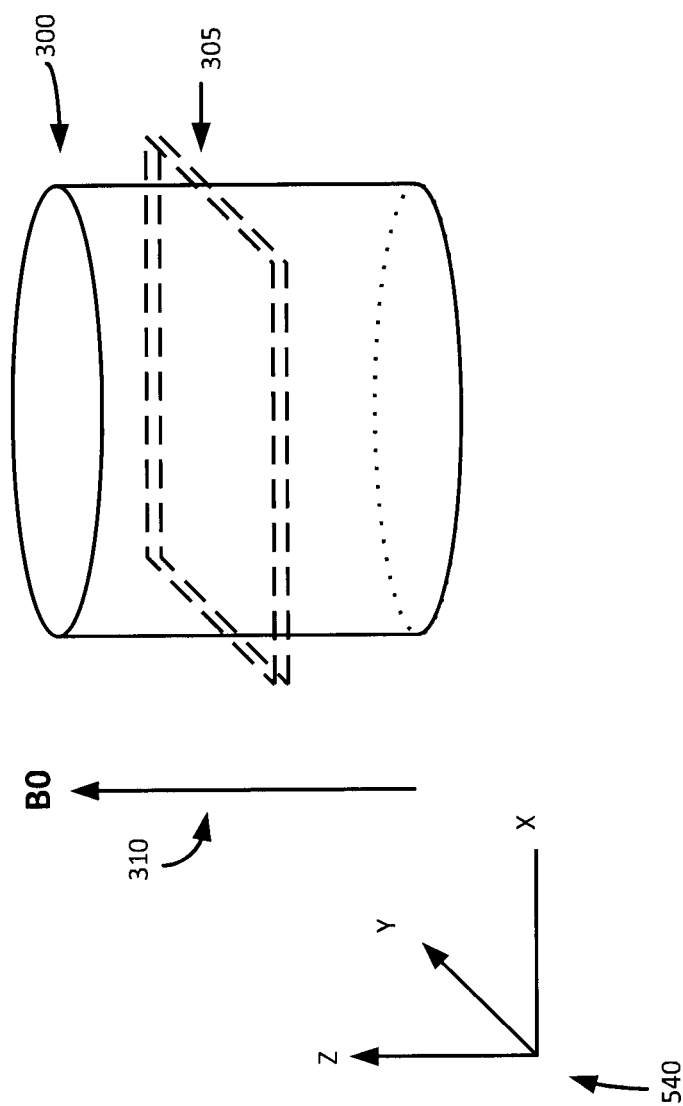
FIG. 3 shows an object and corresponding slice to be scanned by the magnetic resonance system of FIG. 1 in accordance with an implementation.

To further illustrate the signal acquisition process at MRI system 100, it will be assumed that the object being imaged is a cylindrical object as indicated in FIG. 3 at 300. The object 300 has been placed within an external magnetic field B0 at 310, pointing along the Z-axis, and the object subsequently has a net magnetization vector. In this illustrative example, a slice in a plane along the X and Y axes as indicated at 305 is being imaged. It should be noted that in this example, the slice has a finite thickness along the Z-axis, creating a volumetric slice 305. To select a slice, the slice selection gradient pulse 220 is applied along the Z-axis, satisfying the resonance condition for the protons located in the slice 305. Indeed, the location of the slice along the Z-axis is determined based in part on the slice selective gradient pulse 220. Accordingly, the slice selection pulse 210, generated at the same time as the slice selection gradient pulse 220 excites protons that are located within the slice 305 in this example. Protons located above and below the slice 305 are not affected by the slice selection pulse 210.

Continuing with the illustrative example, in accordance with the pulse sequence 200, a phase encoding gradient pulse 230 is applied after the slice selection gradient pulse 220. Assuming this is applied along the Y-axis, the spins at different locations along the Y-axis begin to precess at different Larmor frequencies. When the phase encoding gradient pulse 220 is turned off, the net magnetization vectors at different locations precess at the same rate, but possess different phases. The phases are determined by the duration and magnitude of the phase encoding gradient pulse 230.

Once the phase encoding gradient pulse 230 is turned off, a frequency encoding gradient pulse 240 is turned on. In this example the frequency encoding gradient is in the X direction. The frequency encoding gradient causes protons in the selected slice to precess at rates dependent on their X location. Accordingly, different spatial locations within the slice are now characterized by unique phase angles and precessional frequencies. RF receive coils 130 are used to receive the detected signal 350 generated by the protons contained in the object being scanned while the frequency encoding gradient pulse 230 is turned on.

Figure 4:
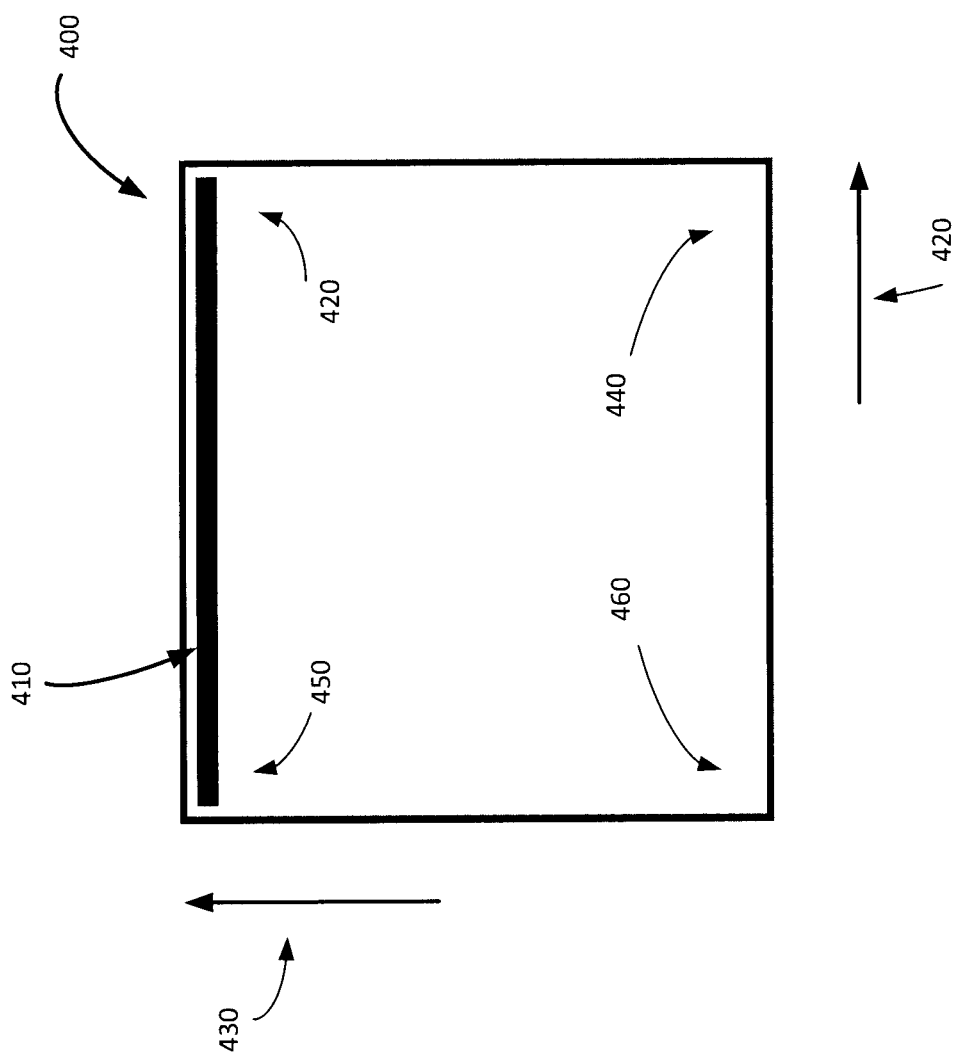
FIG. 4 shows a schematic representation of a k-space containing one received line in accordance with an implementation.

As the pulse sequence 200 is performed by MRI system 100, the acquired signals are stored in a temporary image space matrix referred to as k-space, as shown in FIG. 4 at 400. K-space is the collection of the detected signals measured for a scan and is in the spatial frequency domain. K-space is covered by frequency encoding data along the X-axis 420 (Kx) and phase encoding data along the Y-axis 430 (Ky). When all the lines for the k-space matrix for a slice are received (at the end of the scan of a single slice, for example) the data can be mathematically processed, for example through a two-dimensional Fourier-transform, to produce a final image. Thus, k-space holds raw data before reconstruction of the image into the spatial domain. Typically, k-space has the same number of rows and columns as the final image and is filled with raw data during the scan, usually one line per pulse sequence 200. For example, the first line of k-space 400, indicated at 410 is filled after the completion of the first pulse sequence generated for scanning a slice and contains the detected signal for that pulse sequence. It should be noted that other methods of filling k-space are possible, such as in a spiral manner, and are contemplated.

In some implementations, the MRI system 100 may be configured to dynamically respond to the detected signals in one or more pulse sequences and repeat the pulse sequences as necessary. For example, a common problem in MRI systems is so-called "spike noise". This noise is a spike of broadband noise that is temporally limited. As an example, a spike in the scanned signal may be caused by a strong nearby magnet being turned on temporarily, a door opening in the scanning room and other reasons that will now occur to a person of skill. Due to the methods used in reconstruction of a spatial image from the k-space matrix, such as Fourier Transforms, even a small anomaly such as a temporally limited spike can corrupt an entire reconstructed image for a slice. As an example, the k-space for this illustrative example is taken to be a matrix with the dimensions of 256×256 cells corresponding to a final image resolution of 256×256 which is commonly used for MRI images. If a single cell of the k-space includes a corrupted value, that corrupted cell value can cause the entire resulting image for the slice to be unusable. By constantly monitoring the detected signal 350, the MRI system 100 can detect a spike event (or other artifacts or anomalies), and direct the system to correct the anomaly by, for example, repeating an appropriate section of the scan, or digitally manipulating the signal containing the anomaly. Given the times involved in acquiring image sets using a MRI system, having to repeat scans can be costly. The dynamic response to artifacts can reduce the incidence of scans that need to be discarded due to artifacts.

Figure 5:
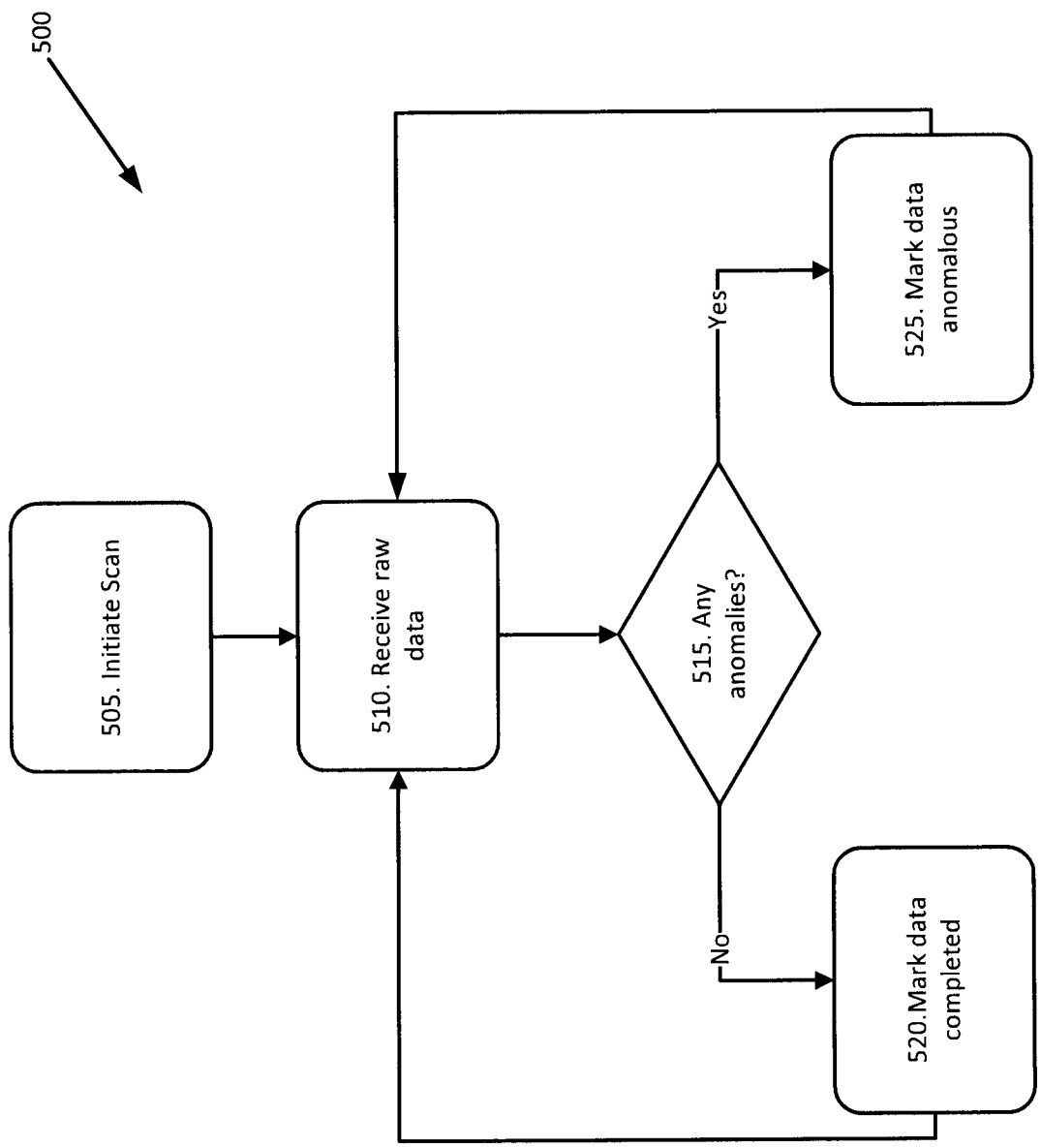
FIG. 5 shows a flow chart showing a method of detecting and correcting MRI scan anomalies.

The MRI system 100 can be configured to detect, while signals are acquired, that one or more values are outside of the normal or expected range of values, and hence are artifacts or anomalous values. Accordingly, the MRI system 100 can dynamically evaluate the received information to detect artifacts while the scan is progressing and the system can be configured to dynamically respond to detected artifacts, for example before the scan has finished. Referring now to FIG. 5, a method of detecting and correcting MRI scan anomalies is indicated generally at 500. In order to assist in the explanation of the method, it'll be assumed that method 500 is operated using the MRI system 100 as shown in FIG. 1. Additionally, the following discussion of method 500 leads to further understanding of system 100. However, it is to be understood that system 100, and method 500 can be varied, and need not work exactly as discussed herein in conjunction with each other, and that such variations are within scope.

Figure 6:
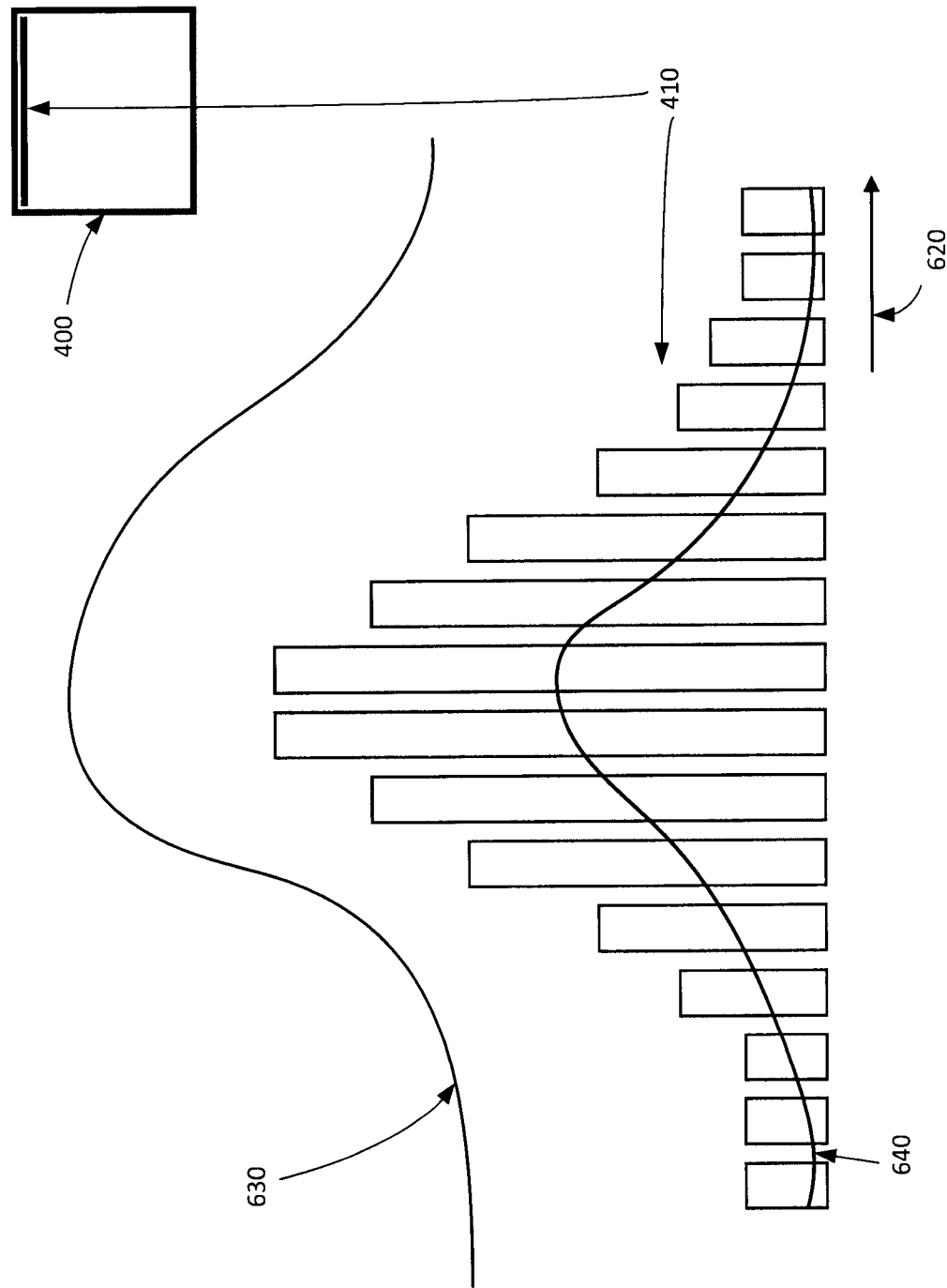
FIG. 6 shows a schematic representation of a line of raw data and a corresponding mask in accordance with an implementation.

Beginning first at 505, a scan is initiated by performing a pulse sequence such as pulse sequence 200 as indicated in FIG. 2. At 510, a portion of raw data is received corresponding to the scan performed. In this example, a line of the k-space matrix is received at data processing system 105 as a result of performing the pulse sequence. Referring to FIG. 6, the received line is indicated at 410. 410 corresponds to line 410 of k-space 400 as also shown in FIG. 4. In FIG. 6, line 410 is additionally shown as a two dimensional bar-graph, displaying the magnitude of each cell in the line as a function of frequency 620. The number of cells in a line is based on the desired resolution of the final scanned image. In this example implementation where the desired resolution for the scanned image is 256×256, each line of the k-space matrix includes 256 cells. For convenience, only a subset of those cells are shown in FIG. 6.

Referring back to FIG. 5, at 515 a determination is made whether the received raw data contains any artifacts or anomalies. This determination can be made by data processing system 105 on the basis of one or more methods used alone or in combination. For example, a predetermined mask or thresholds can be retrieved by processing system 105 corresponding to a particular line of the k-space. An example mask boundary is indicated at line 630 of FIG. 6. Once the mask is retrieved, the values of each of the cells of the signal 410 is compared to the corresponding mask boundary value at that frequency to determine whether any of the scanned values exceed the corresponding mask value.

A mask can be constructed on the basis of apriori information regarding the scan. For example, as it can be seen at 410, a single line of a k-space matrix has a distribution of values, or shape, where the values of cells located toward the center of line 410 have higher magnitudes in comparison to values of cells located towards the ends of line 410. This information can be used in determining the shape of the mask. For example, the mask values can be set to be a percentage higher than average readings for a frequency. Average readings can be determined on the basis of several previously obtained signals for a given k-space line on the basis of similar objects or phantoms.

Another way to use this would be to use the entire neighbourhood of the bad data point along with the symmetric or conjugate symmetric neighbourhood to create the replacement value using one of the interpolation schemes mentioned previously.

In some implementations, additional apriori information can be utilized in constructing a mask. For example, if the MRI system 100 is designed for a single anatomy with a constant field of view (FOV), or the scan is being made of a known tissue type, expected values associated with those specialized systems and scans can be used to further refine the mask. In some other implementations, scans made using test phantoms can be used as the basis of creating a mask or as additional apriori information in refining the mask.

As indicated in FIG. 6, line 630 is an upper boundary for the mask, whereby if a received raw data value exceeds the mask value at a given frequency, there is assumed to be an anomalous value and determination is made that an artifact exists. Some implementations may also include a lower boundary 640 such that if a scanned value is below the lower boundary value, it is assumed to be an anomalous value and determination is made that an artifact exists. In some variations, a mask may only include an upper or a lower boundary.

In this example implementation, all of the values of k-space line 410 are contained within the upper and lower mask boundaries, and thus the determination made is that no artefacts exist in the line 410.

Continuing with method 500, once a determination is made that no artifacts exist in a line, at 520 that line is marked as completed and scanning continues (if the specified scan is not completed for the entire object) with the next line.

Figure 7:
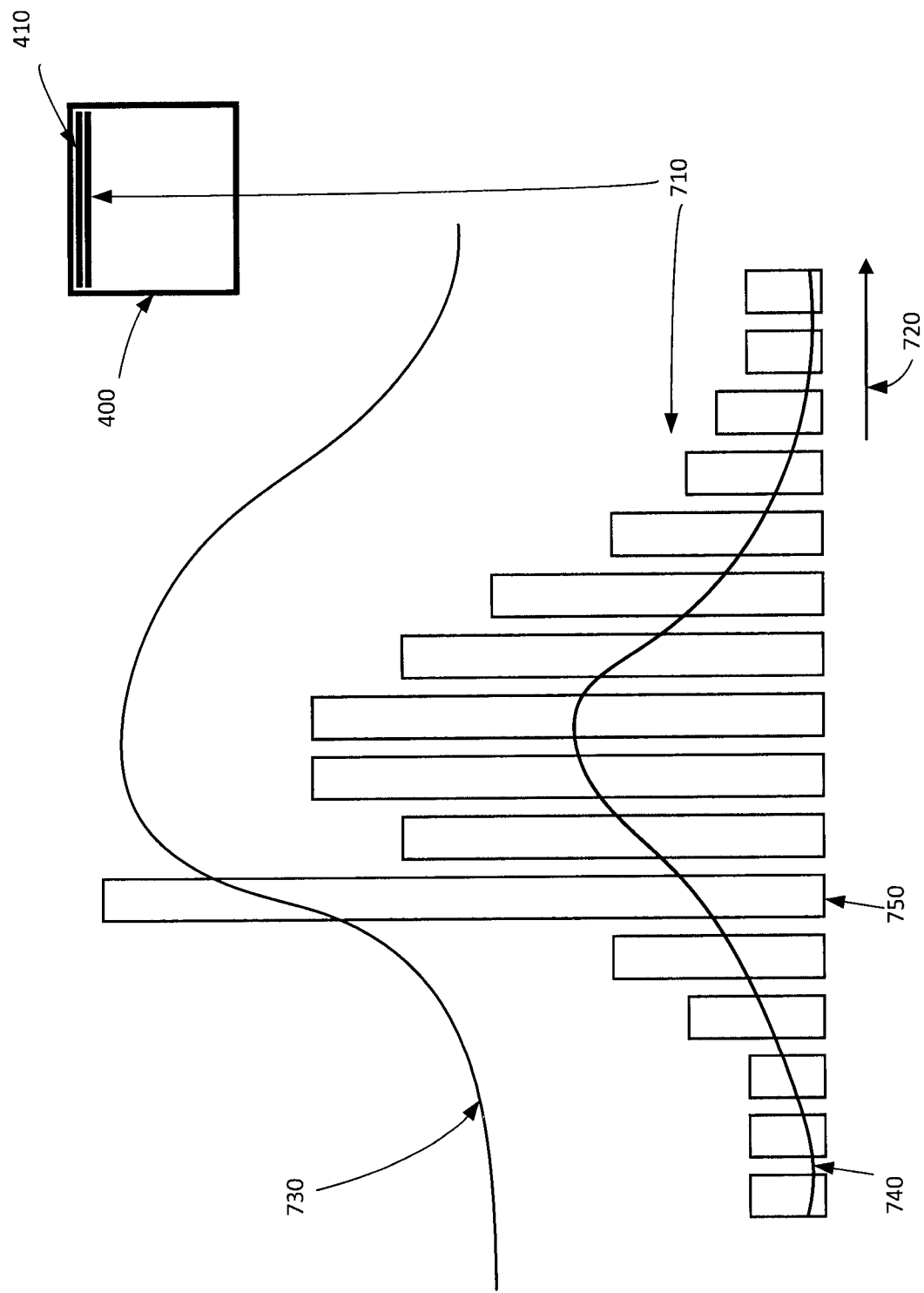
FIG. 7 shows a schematic representation of a second line of raw data and a corresponding mask in accordance with an implementation.

Continuing at 510, the next portion of raw data is received as a consequence of performing a scan using a second pulse sequence, different from the first pulse sequence. In this example, the result of the scan is the acquisition of a second line of k-space data at data processing system 105, as shown in FIG. 7 at 710, along frequency 720.

Referring back to FIG. 5, at 515 a determination is made whether the scanned line, in this case line 710, contains any artifacts or anomalies. Example upper and lower boundary masks are indicated at lines 730 and 740 of FIG. 7, respectively. The values of each of the cells of the signal 710 is compared to the corresponding value of the mask boundaries 730 and 740 to determine whether any of the scanned values are outside of the boundaries set by the mask boundary values. In this example implementation, cell 750's value is found to exceed the upper mask boundary 730 indicating that there is an anomalous value in line 710. Thus, a determination made is that artefacts exist in line 710.

Continuing with method 500, once a determination is made that artifacts exist in a k-space line, at 525 that line is marked as anomalous and is caused to be rescanned. Anomalies such as spike noise tend to be temporally limited events, and so when an offending line is resampled, the spike noise is not likely to reoccur. Accordingly, the system can be directed to repeat the collection of the particular line of the k-space that included the artifact, thus salvaging the image at a cost of extending the scan by $\frac{1}{256}$ of total scan time (rather than requiring the entire scan to be discarded and repeated). The system can also log the occurrence of spike noise so that a service team can be informed. The line that was detected as anomalous can also be stored in memory for inspection by the service team.

In this illustrative example, line 710 is marked for rescanning and the method 500 moves to 510, repeating the scanning with the second pulse sequence, which is the same pulse sequence that was used to initially acquire raw data 710. Accordingly, replacement raw data for line 710 is obtained at 510. Method 500 then continues until all k-space lines in all slices are acquired without any detected anomalies. In some implementations, a maximum number of points that are allowed to be corrected, such as total number of artefacts in a line, slice or number of slices, with this methodology can be specified. When the maximum number is reached, the data can be marked for performing a complete rescan.

In variations, when rescanning the k-space line one or more times, additional scan parameters can be adjusted in an attempt to eliminate the anomaly. For example the scan can be repeated with a slightly different timing if the anomaly remains on repeated attempts to re-acquire the data. The timing variations could involve delaying the TR or re-prescribing the scan with a different TE.

In a variation, the detection of artefacts and/or replacement scans for detected artefacts can be performed at the end of completing each k-space matrix for each slice, or even at the end of completing all k-space matrices for all desired slices. In these variations, the lines with detected anomalies can be rescanned by repeating the pulse sequences used for obtaining that line in the first place. These variations are advantageous in that they allow a greater amount of time to pass between the initial scan and the next scan of a line containing an anomaly, thus increasing the likelihood that the time limited event such as a spike noise that caused the anomaly is over by the time the second or repeat scan of the offending line is performed.

Although the illustrative example utilized line scans, other methods of gathering raw data, such as spiral acquisition of raw data can also be used. In these cases, the determination of anomalies can be delayed until sufficient amount of data is obtained for performing line mask comparisons. Alternatively, differently shaped masks, such as spiral masks, developed to accommodate the particular scanning methodology can also be employed. These and other related variations that will now occur to a person of skill are contemplated. For example, in some implementations, a pre-scan can be performed obtaining fewer lines than the resolution of the slice for each slice. The pre-scan lines can form the basis of anomaly detection. The pre-scans can be repeated until no anomalies are encountered. Alternatively, a low resolution scan can be performed involving a smaller number of voxels for the artefact determination, and once no artefacts are detected, the desired higher resolution scan can be performed. In other variations, test scans using phantoms can be performed, and an expected signal to noise ratio measured for each line or slice based on the phantom scan. If, while scanning an object of interest, the signal to noise ratio for the scan is found to be varied beyond the expected signal to noise thresholds determined on the basis of phantom scans, then it is assumed that artefacts exist and the object scan for that line or slice is repeated. Alternatively, based on the determination that a signal to noise ratio problem exists, the line or slice can then be subjected to method 500 to determine the specific lines where anomalous lines exist.

In some variations, additional measurements can be used in place of or in addition to masks or thresholds. For example, an expected value for a cell can be used in place of a mask. The expected cell value can be based on neighbors of a cell, and the expected cell value can be determined, for example, by averaging or interpolating neighboring cell values. According to this method, if a particular cell's value exceeds (or is below) an expected value determined on the basis of the values of its neighboring cells by a predetermined threshold, such as a predetermined percentage, then the cell is considered to have an anomalous value.

In other variations, expected values for a cell can be determined based on the current scan or based on previously performed similar scans. For example, a number previously obtained scans can be used to obtain an expected value for each cell in the k-space. Previously used scans can be based on the use of the same or similar objects or phantoms for the object. As an example, a database of expected values can be built representing the values for an average signal for the object based on the average of many similar scans using similar objects and/or phantoms. When at least a portion of the k-space is acquired for the current object, the data in the database can be scaled in accordance with the acquired data, using for example, the center point of the k-space and an interpolation map over the area of interest in the k-space can be constructed to provide expected values for the acquired data.

Figure 8:
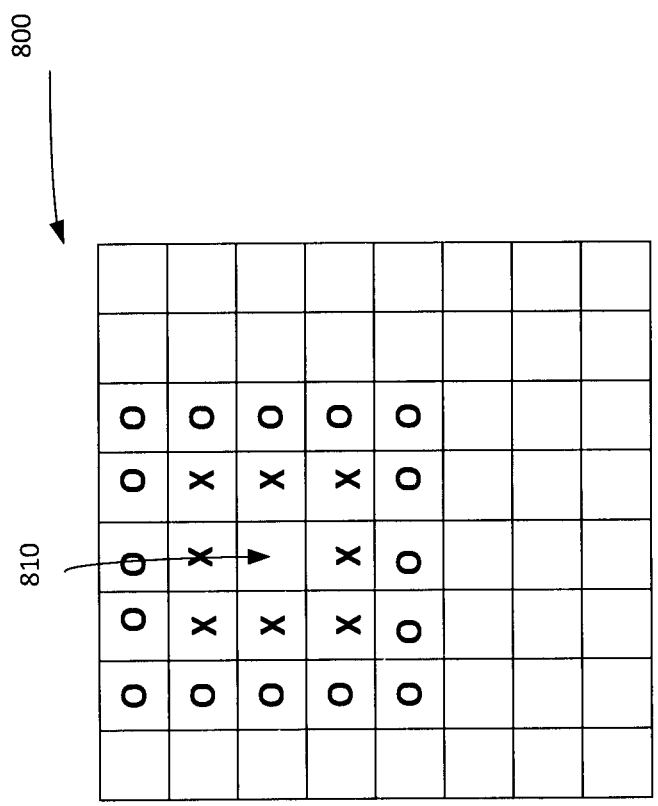
FIG. 8 shows a schematic representation of a portion of a k-space in accordance with an implementation.

Which neighbors to use in determining expected values for a cell can be determined based on rules taking into account proximity and geometric direction from the cell. As a variation, 1 dimensional neighborhood rules can be used. For example, a predetermined number of cells in the k-space line, before and after the cell being evaluated, can be used to calculate an expected value for a cell, such as an average or an interpolation. Alternatively, 2-dimensional neighborhood rules can be used. For example, each cell immediately adjacent to a cell can be considered to be a neighbor of that cell (adjacent neighbor rule). Referring to FIG. 8, 800 shows a 16×16 portion of the raw data forming the 256×256 cell k-space for an image. Based on the adjacent cell definition of a neighbor described above, cell 810 has 8 neighbors, indicated as the cells With XS.

As a further variation, expected values can be determined based on 3 dimensional neighborhood rules, utilizing neighboring cells in 3 dimensions to calculate the expected values. For example, the third dimension could be in k-space, where a 3 dimensional volume image with an additional k-space dimension, kz, in addition to kx and ky of the 2 dimensional k-space discussed in relation to FIG. 4, is obtained. In other variations, the third dimension can be in time where two-dimensional slices discussed above are taken at multiple time steps. Having the addition of time would be particularly useful for contrast injection studies where multiple images are acquired of the same area over a period of time to track to flow of contrast agent through the blood. Typically, when scans are performed and an artefact is found causing the received images to be corrupted a patient currently has to return at a later time to repeat the whole procedure plus get injected with more agent. Application of methodologies and systems described herein would reduce the need to re-perform the entire scan at a later time.

As an additional variation, expected values can be determined based on 4 dimensional neighborhood rules. For example, a 3 dimensional volume scanned along time (namely kx, ky, kz, t) could be used.

According to an alternative neighbor rule for 2 or 3 dimensional neighbor selection, only diagonally connected cells may be considered to be neighbors. In another variation, cells two deep from the cell under evaluation can be defined as neighbors, resulting, for 2 dimensions, in a total of 24 neighbors (as shown by cells marked with Os and Xs in FIG. 8). In further variations, more or fewer neighbors can be used, and these variations are contemplated. It should be noted that in order to calculate an average expected value for a cell based on some neighbor rules, such as the adjacent neighbor rule, in addition to receiving the k-space line being evaluated, the next line of the k-space must also be obtained. Accordingly, the detection of anomalies based on such neighborhood rules would be delayed until the k-space lines in addition to the one being evaluated were acquired. One way to eliminate the need to wait for one or more additional lines is to only use neighbors from the current and previously obtained data only.

The expected value for a cell can be calculated using various methods. For example, an average value for the neighbors can be calculated by summing the values and dividing the sum by the total number of neighbors. Other methods for determining averages based on neighbors will now occur to a person of skill and are contemplated.

As a further example of calculating expected values for a cell, interpolations based on neighbors within k-space (i.e. kx, ky, kz points described within the current draft) based on cubic, bi-cubic, or tri-cubic interpolations can be used to perform 1 dimensional, 2 dimensional, and 3 dimensional interpolations respectively. For cell neighbors in time (i.e. same k-space position within the matrix but adjacent acquisitions in time) a linear interpolation can be used. Alternatively, a method based on a model of how the signal should change in time could also be used. For example for a contrast injection, the received signal is typically low, then increases rapidly when the agent hits the imaging plane, then decreases slowly in intensity as the agent "washes out". The time-point within this sequence could be determined by reconstructing the central portion of k-space (giving a very low resolution image) and comparing average signal intensity over the image.

In some variations conjugate symmetry of a k-space can be used in identifying an expected value for a cell. Referring to FIG. 4, for example, the upper right hand corner 420 of the k-space is symmetric with the lower left corner 460, the upper right corner 420 is the symmetric complex conjugate of the upper left corner 450, and the upper right corner is also the symmetric complex conjugate of the lower right corner 440. Accordingly, to obtain an expected value for a cell, the symmetric, or conjugate symmetric cell in k-space can be identified, and its value can be used as the expected value for the cell being evaluated.

In further variations, anomalies can be corrected through digital manipulation of the obtained signal as opposed to repeating the scan of an offending k-space portion. For example, the expected values calculated for a cell, can be used to replace the value of that cell if the value of that cell is detected as anomalous. The artefact can be detected using one or more detection methods such as masking, expected value or other that will now occur to a person of skill. When a value is detected as anomalous in accordance with any of the detection methods, then the value can then be replaced by an expected value calculated on the basis of averaging, interpolation, conjugate symmetry or other methods of calculating expected values that will now occur to a person of skill. In some variations, the digital error correction may be attempted when a predetermined number of re-scans of the offending data is not able to correct the anomaly. In other variations, the digital correction can be performed along with or in addition to re-scanning of the offending raw data. These and other variations that will now occur to a person of skill are contemplated.

In some implementations, pre-scans or low resolution scans can also be corrected using expected values.

Although the illustrative example utilized gradient-echo imaging, in other implementations method 500 can be applied to other types of imaging methods such as multi-slice imaging, volume imaging or oblique imaging, spin-echo imaging, inversion recovery imaging and others that will now occur to a person of skill.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

We claim:

1. A method of data acquisition at a magnetic resonance imaging (MRI) system comprising:
   receiving at the magnetic resonance imaging (MRI) system at least a portion of raw data for an image;
   detecting at the magnetic resonance imaging (MM) system anomalous data in the portion of raw data; and
   performing at the magnetic resonance imaging (MRI) system a correction of the anomalous data, wherein performing the correction involves performing a partial scan to obtain replacements for the anomalous data;
   wherein detecting anomalous data further comprises comparing the portion of raw data received to a mask.

2. The method of claim 1 wherein the mask includes an upper boundary and the detection is based on whether one or more values of the portion of raw data received exceed corresponding upper boundary values.

3. The method of claim 1 wherein the mask includes a lower boundary and the detection is based on whether one or more values of the portion of raw data received are below corresponding lower boundary values.

4. The method of claim 1 wherein the mask is determined at least in part based on apriori information including at least one of: type of object being scanned, type of the MM system, expected distribution of raw data values or raw data obtained from phantom scans.

5. The method of claim 1 wherein mask values are expected values for the partial data varied by a pre-determined percentage.

6. The method of claim 1 wherein detecting anomalies further includes comparing a signal to noise ratio of at least a portion of raw data received to a predetermined signal to noise ratio for a phantom.

* * * * *